(12) United States Patent
Hu et al.

(10) Patent No.: US 12,549,186 B2
(45) Date of Patent: Feb. 10, 2026

(54) PLL WITH A CONTROLLED RANGE OF OUTPUT FREQUENCY FOR MEMS GYROSCOPE

(71) Applicant: STMicroelectronics International N.V., Geneva (CH)

(72) Inventors: Yamu Hu, Allen, TX (US); Naren Kumar Sahoo, Frisco, TX (US); Pavan Nallamothu, Little Elm, TX (US); Deyou Fang, Frisco, TX (US); David McClure, Carrollton, TX (US)

(73) Assignee: STMicroelectronics International N.V., Geneva (CH)

( * ) Notice: Subject to any disclaimer, the term of this patent is extended or adjusted under 35 U.S.C. 154(b) by 15 days.

(21) Appl. No.: 18/635,877

(22) Filed: Apr. 15, 2024

(65) Prior Publication Data

US 2025/0323650 A1 Oct. 16, 2025

(51) Int. Cl.
*H03L 7/099* (2006.01)
*H03L 7/089* (2006.01)
*H03L 7/091* (2006.01)
*H03L 7/18* (2006.01)

(52) U.S. Cl.
CPC ............ *H03L 7/099* (2013.01); *H03L 7/0891* (2013.01); *H03L 7/091* (2013.01); *H03L 7/18* (2013.01)

(58) Field of Classification Search
CPC ............ H03L 7/093; H03L 7/085; H03L 7/08
See application file for complete search history.

(56) References Cited

U.S. PATENT DOCUMENTS

| | | | |
|---|---|---|---|
| 5,955,928 A | 9/1999 | Smith et al. | |
| 7,030,669 B2 * | 4/2006 | Hulfachor | H03K 3/0322 |
| | | | 327/156 |
| 8,960,001 B2 * | 2/2015 | Rizzo Piazza Roncoroni ............ | |
| | | | H03L 3/00 |
| | | | 73/504.12 |
| 10,447,253 B2 | 10/2019 | Khare | |
| 10,715,158 B1 | 7/2020 | Joshi | |
| 11,239,848 B1 | 2/2022 | Zhang | |
| 11,715,060 B2 | 8/2023 | Kawaguchi | |
| 2020/0195259 A1 | 6/2020 | Zhang | |
| 2023/0275588 A1 | 8/2023 | Issa | |

FOREIGN PATENT DOCUMENTS

| | | |
|---|---|---|
| CN | 103036560 | 4/2013 |
| CN | 117491744 A | 2/2024 |

* cited by examiner

*Primary Examiner* — Diana J. Cheng
(74) *Attorney, Agent, or Firm* — Slater Matsil, LLP

(57) ABSTRACT

According to an embodiment, a phased-locked loop (PLL) circuit, within a gyroscope system, generates demodulation signals. It includes a phase frequency detector receiving gyroscope output, which compares a reference signal with a feedback signal to produce an error signal. A charge pump then converts this error into a first analog control signal. A programmable clamp circuit refines this into a second analog control signal. A voltage-controlled oscillator uses the second signal to produce an output signal at a controlled frequency determined by the clamp circuit. A frequency divider sends a comparison frequency signal back to the detector, completing the loop.

20 Claims, 8 Drawing Sheets

PLL WITH A CONTROLLED RANGE OF OUTPUT FREQUENCY FOR MEMS GYROSCOPE

TECHNICAL FIELD

The present disclosure generally relates to electronic devices and, in particular embodiments, to a phase-locked loop with a controlled range of output frequency for a Micro-Electro-Mechanical Systems (MEMS) gyroscope.

BACKGROUND

A Micro-Electro-Mechanical Systems (MEMS) gyroscope operates as a coupled spring-mass-damping system and inherently possesses multiple resonant modes. The implementation of an effective startup control mechanism ensures that the device's proof mass oscillates at the desired resonant mode, typically the anti-phase drive mode.

It is common to utilize an on-chip phase-locked loop (PLL) circuit for the startup control mechanism. The PLL circuit provides an accurate resonance frequency and supports digital signal processing requirements. The operational frequency range of the PLL is set to be sufficiently broad to account for variations in the MEMS and application-specific integrated circuit (ASIC) manufacturing processes as part of the integrated system.

However, there is a limitation to the operational frequency range of the PLL as it cannot be overly broad since a higher clock frequency may complicate the timing closure within digital processing circuits. Further, if the output range of the PLL clock is too wide, there is a risk that the MEMS device may erroneously lock into spurious modes, an event that might occur during power interruptions in the field.

SUMMARY

Technical advantages are generally achieved by embodiments of this disclosure, which describe a phase-locked loop with a controlled range of output frequency for a Micro-Electro-Mechanical Systems (MEMS) gyroscope.

A first aspect relates to a phased-locked loop (PLL) circuit for generating demodulation signals in a gyroscope system. The PLL circuit includes a phase frequency detector coupled to an output of a gyroscope in the gyroscope system, the phase frequency detector configured to generate an error signal by comparing an input reference signal with a feedback comparison frequency signal; a charge pump configured to translate error information of the error signal into a first analog control signal; a programmable clamp circuit configured to generate a second analog control signal from the first analog control signal; a voltage-controlled oscillator configured to receive the second analog control signal and generate an output signal having a regulated frequency, wherein the regulated frequency is set by the second analog control signal generated by the programmable clamp circuit; and a frequency divider configured to provide the feedback comparison frequency signal to the phase frequency detector based on the regulated frequency of the output signal.

A second aspect relates to system that includes a gyroscope configured to detect changes in a vibration of a proof mass due to a drive motion by generating first signals; a charge-to-voltage converter configured to convert the first signals to a differential sine wave signal, the first signals being charge signals, and the differential sine wave signal being equivalent voltage signals to the first signals; and a drive comparator configured to eliminate false pulses due to high-frequency signals and noise superimposed on top of the differential sine wave signal; a phase frequency detector coupled to an output of the drive comparator, the phase frequency detector configured to generate an error signal by comparing a first output signal at the output of the drive comparator with a feedback comparison frequency signal; a charge pump configured to translate error information of the error signal into a first analog control signal; a programmable clamp circuit configured to generate a second analog control signal from the first analog control signal; a voltage-controlled oscillator configured to receive the second analog control signal and generate a second output signal having a regulated frequency, wherein the regulated frequency is set by the second analog control signal generated by the programmable clamp circuit; and a frequency divider configured to provide the feedback comparison frequency signal to the phase frequency detector based on the regulated frequency of the second output signal.

A third aspect relates to a method for calibrating a phased-locked loop (PLL) circuit used to generated modulation signals in a gyroscope system. The method includes arranging the PLL circuit in an open loop configuration; setting an input voltage to a programmable clamp circuit of the PLL circuit to zero volts in response to the programmable clamp circuit being configured as a p-channel current mirror controlled oscillator or set to a supply voltage of the gyroscope system in response to the programmable clamp circuit being configured as an n-channel current mirror controlled oscillator; sweeping the settings for each programmable transistor of the programmable clamp circuit to minimize an error signal between an output signal of the PLL circuit and a target value corresponding to a maximum value of a regulated frequency at an output of the PLL circuit; storing in a memory the settings for each programmable transistor based on determining values for each programmable transistor with a minimal error signal during the sweep; and applying the settings for each programmable transistor from memory during a startup phase of the gyroscope system.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Figure 1:
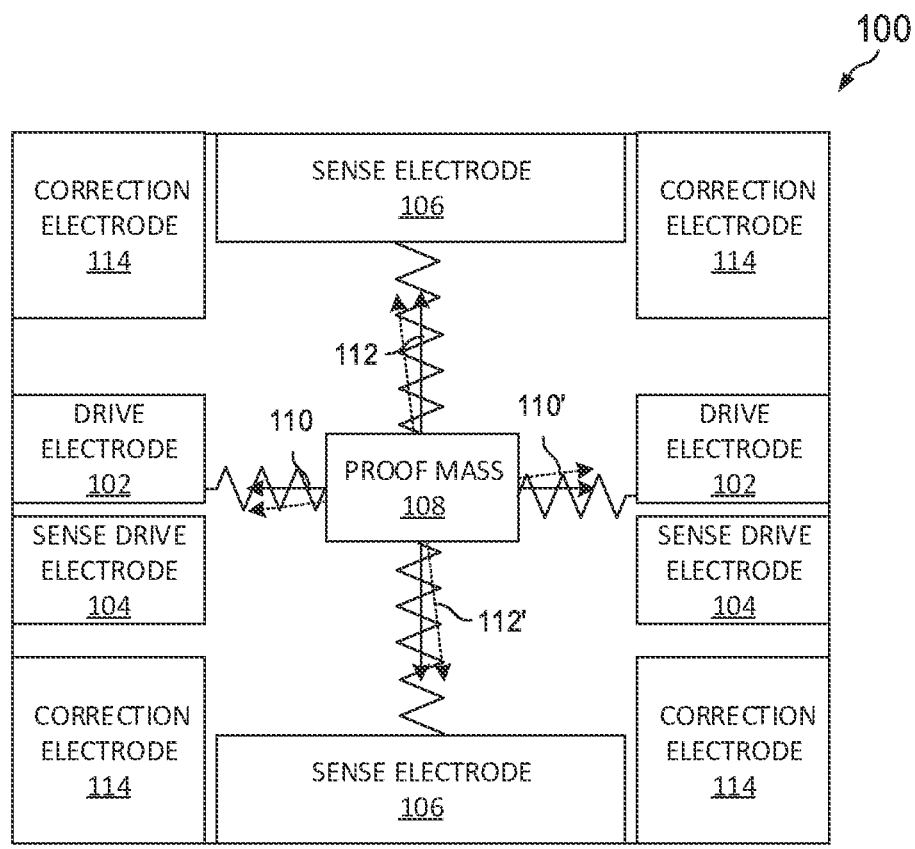
FIG. 1 is a Micro-Electro-Mechanical Systems (MEMS) gyroscope.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

Aspects of this disclosure are related to improving the robustness of the PLL output clock signal during the startup phase of the gyroscope sensor in automotive applications. Recent advancements in automotive active safety applications have required gyroscopes to become operational quickly following the ignition of the vehicle (key-on). This necessitates that the gyroscope, which includes the drive, sense, and quadrature components, be equipped with a startup procedure that is not only robust but also rapid, even in situations where power may have been interrupted. Moreover, the new generation of gyroscopes increasingly demands higher drive resonance frequencies to enhance stability and performance amidst the intense vibrations encountered during on-road conditions.

Enhancements in zero-rate output (ZRO) stability over temperature fluctuations and time are also critical, which calls for a demodulation clock with ever-greater resolution in both frequency and phase. To accommodate these constraints, the on-chip phase-locked loop (PLL) circuit must provide a wide operational range to compensate for variations in the MEMS and ASIC processes. However, there is a concern that an excessively high PLL output frequency could cause digital circuits, such as flip-flops, to enter undefined states, potentially leading to startup failures in the gyroscope.

In embodiments, the resonance frequency of the signal at the input of the PLL circuit 228 is 30 KHz. In embodiments, the resonance frequency of the signal at the output of the PLL circuit is 30 MHz. For automotive applications, for example, the resonance frequency is increased to have better vibration robustness.

To tackle these issues, conventional approaches typically involve reducing the drive resonance frequency, decreasing the PLL ratio, or implementing more stringent timing closure constraints, with consideration given to the highest clock frequency that might occur. The drawbacks of these methods include a compromise in vibration performance due to the lower drive resonance frequency, a degradation of zero-rate output (ZRO) stability when the PLL ratio is reduced, and an increase in both the physical area and power consumption required to impose tighter timing closure constraints. These trade-offs negatively affect both the operational robustness of the gyroscope and its efficiency.

Embodiments of this disclosure propose a phase-locked loop circuit with a programmable clamp to prevent the output frequency of the PLL circuit from exceeding a specific frequency and preventing damage to the digital circuits and potential startup failures at the gyroscope. These and additional details are further detailed below.

FIG. 1 illustrates a Micro-Electro-Mechanical Systems (MEMS) gyroscope 100. MEMS gyroscope 100 includes a pair of drive (D) electrodes 102, a pair of sense drive (SD) electrodes 104, a pair of sense (S) electrodes 106, and a proof mass 108. MEMS gyroscope 100 is configured to measure the rotation rate by exploiting the Coriolis effect.

The drive (D) electrodes 102 set the proof mass 108 into oscillatory motion. They accomplish this by applying an alternating voltage or an electrostatic force to the proof mass 108, causing it to vibrate at a natural or a resonant frequency along the drive axis 110. This vibration is necessary to create the conditions under which the Coriolis force can be observed and measured. Without this consistent and controlled motion, detecting angular rotation based on the Coriolis effect would not be possible.

The sense drive (SD) electrodes 104 detect changes in the vibration of the proof mass 108 due to the drive motion. This detection can be used in feedback control systems where constant oscillation amplitude is necessary for accurate measurements.

The proof mass 108, a vibrating structure, oscillates along the drive axis 110. When the MEMS gyroscope 100 experiences rotation about the sense axis 112, which, in an ideal MEMS gyroscope, is perpendicular to the drive axis 110, the Coriolis force comes into play. This force results from the rotation and acts perpendicular to the drive axis 110 and the sense axis 112, causing the proof mass 108 to deflect.

Due to the Coriolis force, the mass deflection perpendicular to the rotation and the drive axis alters the capacitance between the proof mass 108 and the sense (S) electrodes 106, which can be read as a Coriolis signal indicative of the rotational rate.

The raw Coriolis signal contains valuable information about the rotation rate but requires processing to isolate and extract this information. Through demodulation, which typically involves filtering and amplification, the raw signal is refined to produce what is known as the rate signal. The rate signal represents the device's rotational rate and is a clean measurement of how fast and in what direction the MEMS gyroscope 100 is rotating. The processing removes unwanted components at the drive frequency and other noise, ensuring an accurate portrayal of angular velocity.

As noted, in an ideal MEMS gyroscope, the drive axis 11o is perpendicular to the sense axis 112. However, due to various imperfections during manufacturing, the drive axis 110 is not perfectly perpendicular to the sense axis 112 in a real MEMS gyroscope. The angular imperfection between the two axes leads to unintended parasitic coupling in the sense direction due to the motion of the drive component. The unintended parasitic coupling results in an undesirable quadrature error.

Generally, the quadrature error manifests as a signal 90 degrees out of phase with the Coriolis signal and is several magnitudes larger than the rate signal. Without correction, this quadrature error leads to erroneous outputs known as zero rate outputs (ZRO), ZRO drift, and additional noise within the rate signal. A correction force becomes necessary to counteract the quadrature error, dependent on the common and differential modes applied to the quadrature electrodes. This force is tuned in relation to the voltage of the MEMS rotor.

In embodiments, the quadrature correction electrodes 114 may be capacitive, resistive loads, or a combination thereof. Quadrature correction electrodes 114 are configured to mitigate the quadrature error in MEMS gyroscope 100. They operate after detecting capacitive changes associated with the quadrature motion through the sense (S) electrodes 106.

Once this motion is identified, a corrective feedback mechanism is engaged. The feedback mechanism typically generates a compensation signal tuned to offset the detected quadrature error. The signal is applied as a voltage to the quadrature correction electrodes 114, which create electrostatic forces to counteract the unwanted quadrature motion upon the proof mass 108. The magnitude and phase of the compensation signal can be adjusted through a manual tuning process or with an automated control system, which could be either open-loop or closed-loop.

Figure 2:
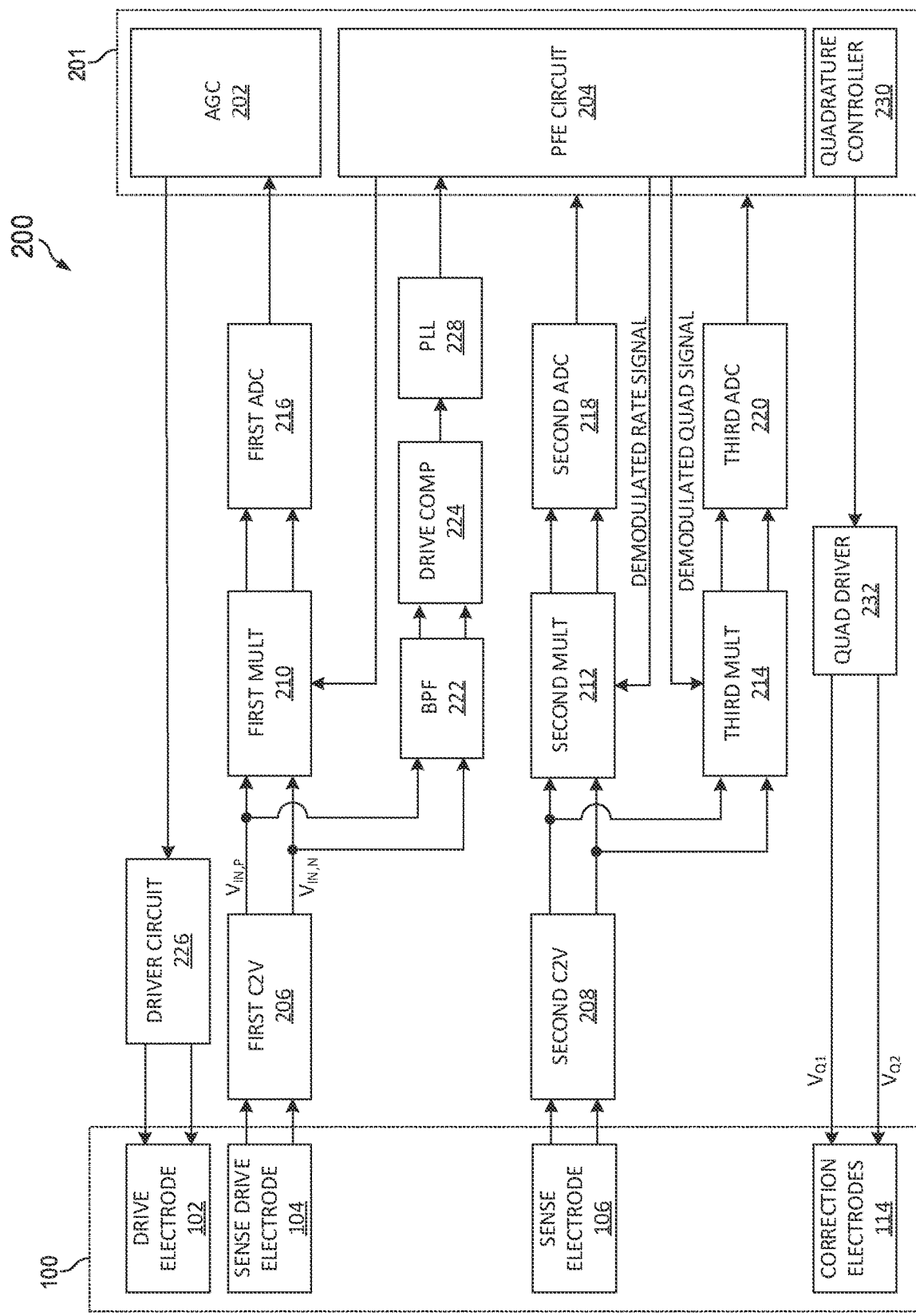
FIG. 2 is a block diagram of an embodiment system.

FIG. 2 illustrates a block diagram of an embodiment system 200. System 200 includes the MEMS gyroscope 100, a digital circuit 201 that includes an automatic gain control (AGC) circuit 202 and a phase frequency extractor (PFE) circuit 204, a first charge-to-voltage (C2V) converter 206, a second C2V converter 208, a first multiplier 210, a second multiplier 212, a third multiplier 214, a first analog-to-digital converter (ADC) 216, a second ADC 218, a third ADC 220, a band-pass (BP) filter 222, a drive comparator 224, a driver circuit 226, a phase-locked loop (PLL) circuit 228, and a quadrature driver 232, which may (or may not) be arranged as shown. The digital circuit 201 includes an automatic gain control (AGC) circuit 202, the PFE circuit 204, and a quadrature controller 230. System 200 may include additional components that are not shown. For example, the digital circuit 201 may include a controller that receives the measurements from the second ADC 218 and the third ADC 220.

AGC circuit 202 is configured to regulate the amplitude of vibrations of the proof mass 108 in the MEMS gyroscope 100 to maintain the precision of the measurements. AGC circuit 202 produces a digital control signal to the driver circuit 226. The driver circuit 226 generates an analog differential control signal from the digital control signal. The analog differential control signal is fed to the drive (D) electrodes 102 of the MEMS gyroscope 100 to control the oscillation of the proof mass 108.

The sense drive (SD) electrodes 104 detect variations in the vibration amplitude of the proof mass 108 caused by the drive motion. The detected changes are used for the feedback control mechanisms to sustain a constant oscillation amplitude, ensuring accurate and consistent measurements from the MEMS gyroscope 100.

The analog signal from the sense drive (SD) electrodes 104, representing the detected changes, is directed to the first C2V converter 206. First C2V converter 206 is configured to transform the analog charge signal into an equivalent voltage signal more suitable for subsequent electronic processing.

Following conversion, the voltage signal output from the first C2V converter 206 is supplied to the first multiplier 210. Concomitantly, the first multiplier 210 receives a second input, a digital signal from the PFE circuit 204. PFE circuit 204 alters the reference signal frequency to align it with the operational needs of system 200.

The first multiplier 210 blends the two signals—the converted voltage from the first C2V converter 206 and the digital signal from the PFE circuit 204—to produce an output that carries information about the motion of the proof mass 108.

The product signal from the first multiplier 210 is conveyed to the first ADC 216. The first ADC 216 is configured to digitize the analog signal from the first multiplier 210 so that digital circuits can process it. The digital output from the first ADC 216 is provided to the AGC circuit 202 as part of a feedback control loop.

Within this feedback loop, the AGC circuit 202 analyzes the digital information given by the first ADC 216 to gauge whether adjustments are necessary. If so, the AGC circuit 202 modifies its digital output to the driver circuit 226 accordingly, creating a closed-loop system that maintains stable and precise control over the vibration amplitude of the drive (D) electrodes 102. This closed-loop system ensures that the MEMS gyroscope 100 functions with a high degree of accuracy.

To ensure the high precision and stability of the MEMS gyroscope 100 across different processes and temperatures throughout its lifespan, it is advantageous to operate it at resonance while maintaining a tightly controlled drive amplitude. Correcting any quadrature error present in system 200 allows for obtaining a dependable rate signal. The valuable data regarding this is encapsulated within the sine wave output produced by the sense drive (SD) electrodes 104. This sine wave must undergo demodulation and be digitized for further use.

The sense drive (SD) electrodes 104 output a sine wave voltage waveform. The amplitude of this waveform is directly proportional to the drive applied to the MEMS gyroscope 100, and its frequency matches the resonance frequency (Fa) of the MEMS drive. The output of the first C2V converter 206 is additionally provided to the band-pass filter 222. The band-pass filter 222 is configured to eliminate the DC component—such as offsets—and any high-frequency signals that may be superimposed on top of resonance frequency ($F_d$). After this filtering stage, the drive comparator 224 transforms the sine wave into a square wave at the same resonance frequency ($F_d$). The square wave resonance frequency ($F_d$) is the input for the PLL circuit 228. PLL circuit 228 is configured to generate multiples of the resonance frequency ($F_d$), which are then utilized by the PFE circuit 204 to create demodulation signals.

The analog sine wave from the sense drive (SD) electrodes 104, which flags variable amplitude based on whether the MEMS gyroscope 100 is in startup or normal mode and is accompanied by higher order harmonics of the resonance frequency ($F_d$), as well as noise, is transformed into a square wave by the drive comparator 224. The drive comparator 224 generates the square wave signal at the resonance frequency ($F_d$) by processing the input differential sine wave. The drive comparator 224 is designed to be high-speed to prevent the propagation delay from causing any demodulation errors-such discrepancies are typically addressed during production trimming to ensure that they do not contribute to further errors over the operational life of the MEMS gyroscope 100.

False transitions caused by input noise can produce incorrect resonance frequency ($F_d$) pulses, compromising the precision required for proper demodulation. Comparator hysteresis is set during production to negate the potential effects of the higher-order resonance frequency ($F_d$) and any noise superimposed on the resonance frequency ($F_d$) sine signal. System 200 can effectively reject unwanted signals by programming the parameter at the manufacturing stage, ensuring the MEMS gyroscope 100 functions correctly.

The demodulation signals from the PFE circuit 204 are applied to the first multiplier 210 in the path of the sense drive (SD) electrode, and the second multiplier 212 and the third multiplier 214 in the path of the sense (S) electrode.

The demodulation signal for the sense drive (SD) electrodes 104 is the resonance frequency ($F_d$), which is fed into the feedback control loop at the first multiplier 210. This allows the AGC circuit 202 to provide a digital signal to the driver circuit 226 and keep the MEMS gyroscope 100 tuned to its resonant frequency and at the desired amplitude level.

The sense (S) electrodes 106 carries information about the rate of movement and the quadrature-phase, necessitating demodulation by an appropriate phase signal to extract this information. The demodulated rate signal ($RATE_S$) for the sense (S) electrodes 106 takes the form of a cosine function ($RATE_C = \cos((\omega_d)t)$), where $\omega_d$ is the angular drive frequency of the MEMS gyroscope 100. The demodulated rate signal ($RATE_S$) for the sense (S) electrodes 106 indicates angular velocity. It is provided as an input for the second multiplier 212. A second input of the second multiplier 212 is the output of the sense (S) electrodes 106. The output of the second multiplier 212 is fed to the second ADC 218 as a digital signal indicating the rate signal.

The demodulated quadrature signal ($QUAD_S$) for the sense (S) electrodes 106 takes the form of a sine function ($QUAD_S = \sin((\omega_d)t)$). The demodulated quadrature signal ($QUAD_S$) for the sense (S) electrodes 106 is used to evaluate and correct the quadrature errors within the MEMS gyroscope 100, contributing to a stable Zero Rate Level (ZRL) and minimizing rate noise. The demodulated quadrature signal ($QUAD_S$) is provided as an input to the third multiplier 214. A second input of the third multiplier 214 is the output of the sense (S) electrodes 106. The output of the third multiplier 214 is fed to the third ADC 220 as a digital signal indicating the quadrature error.

Based on the digital signal from the third ADC 220 indicating the MEMS gyroscope's quadrature error, the quadrature controller 230 provides a digital signal to the quadrature driver 232 to correct the quadrature error through the quadrature correction electrodes 114.

The quadrature driver 232 generates a signal from the digital signal, a first voltage ($V_{Q1}$) and a second voltage ($V_{Q2}$), which are applied to a respective one of the pair of quadrature correction electrodes 114 to offset the detected quadrature error.

Figure 3:
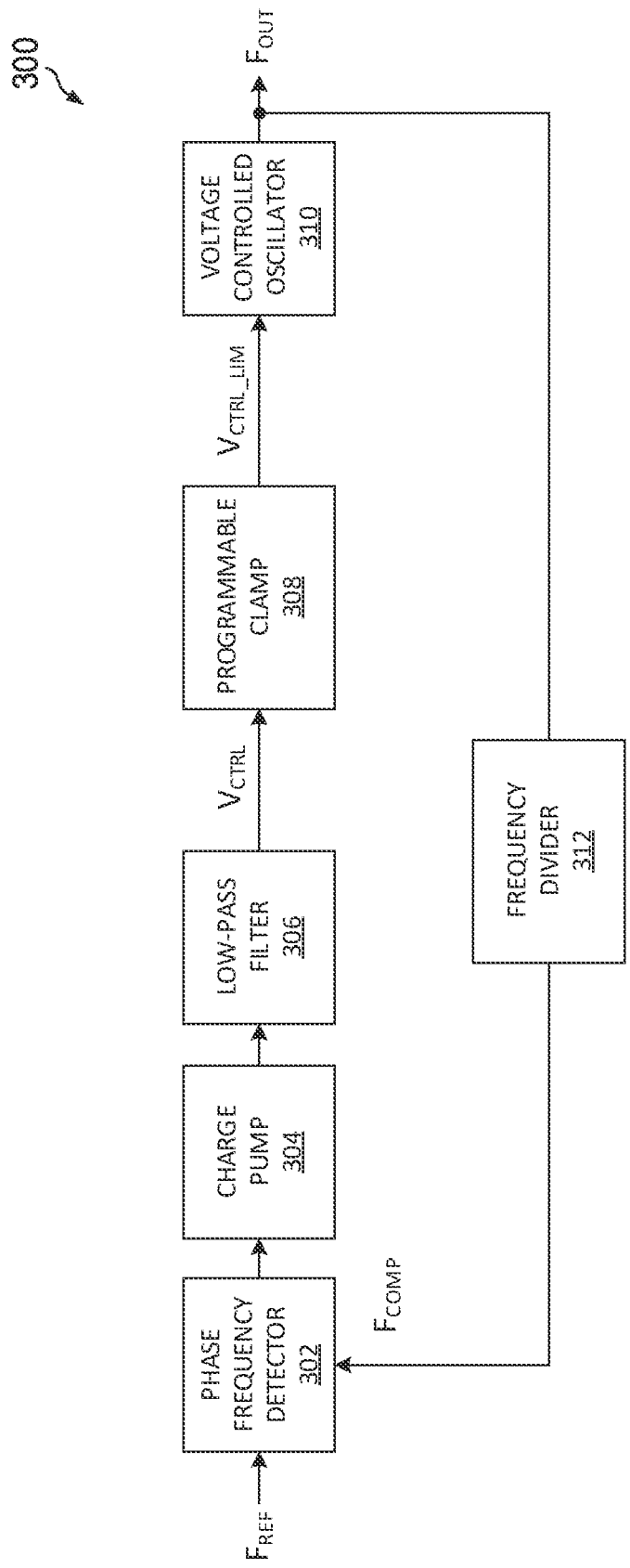
FIG. 3 is a block diagram of an embodiment phase-locked loop circuit.

FIG. 3 illustrates a block diagram of an embodiment phase-locked loop circuit 300, which may be implemented as the PLL circuit 228 in system 200. PLL circuit 300 includes a phase frequency detector (PFD) 302, a charge pump (CP) 304, a low-pass filter (LPF) 306, a programmable clamp 308, a voltage-controlled oscillator (VCO) 310, and a frequency divider 312, which may (or may not) be arranged as shown. PLL circuit 300 may include additional components not shown.

PLL circuit 300 is configured to generate (i.e., synchronize) an output signal ($F_{OUT}$) with a fixed phase and frequency relative to the input reference signal ($F_{REF}$). The PLL circuit 300, by incorporating the frequency divider 312, can generate a stable frequency that is a multiple of the input reference signal ($F_{REF}$).

In embodiments, the input reference signal ($F_{REF}$) is the output signal from the drive comparator 224. In embodiments, the output signal ($F_{OUT}$) is the output signal of the PLL circuit 228 to the digital circuit 201.

The phase frequency detector 302 is configured to generate an error signal by comparing the input reference signal ($F_{REF}$) with the feedback comparison frequency signal ($F_{COMP}$) from the output of the voltage-controlled oscillator 310.

The error signal, being proportional to the phase difference between the input reference signal ($F_{REF}$) and the feedback comparison frequency signal ($F_{COMP}$), is directed to the charge pump 304. The charge pump 304 translates the error information of the error signal into an analog control voltage.

The low-pass filter 306 receives the analog control voltage from the output of the charge pump 304. It smoothens any high-frequency components such that only valid phase errors are used to adjust the voltage-controlled oscillator 310. The output of the low-pass filter 306 is fed to the programmable clamp 308 as a voltage control ($V_{CTRL}$) signal.

The programmable clamp 308 is configured to generate a limited voltage control ($V_{CTRL\_LIM}$) signal with a programmable clamping voltage calibrated to a preset maximum frequency. Advantageously, the programmable clamp 308 has a small footprint, requires minimal power resources for operation, and has a simple calibration procedure. The limited voltage control ($V_{CTRL\_LIM}$) signal, advantageously, operates at a lower frequency than the voltage control ($V_{CTRL}$) signal, and within the operating range of the digital circuit 201.

Without the programmable clamp 308, the frequency range at the output of the PLL circuit 300 can be between 50 and 130 MHz during, for example, the startup phase or in response to system vibration, which can be outside the operating range of the digital circuit 201.

Advantageously, the programmable clamp 308 reduces the high-end frequency range at the output of the PLL circuit 300, such that the frequency range of the output signal ($F_{OUT}$) is within the operating range of the digital circuit 201. In embodiments, the limited voltage control ($V_{CTRL\_LIM}$) signal is calibrated such that the output signal ($F_{OUT}$) is below the maximum operating range of the digital circuit 201 within a set margin.

The limited voltage control ($V_{CTRL\_LIM}$) signal is fed to the voltage-controlled oscillator 310, configured to generate an oscillating frequency signal that changes in response to the limited voltage control ($V_{CTRL\_LIM}$) signal.

The oscillating frequency signal is passed through the frequency divider 312, configured with a division ratio of N, where N is an integer greater than 1. The frequency divider 312 is configured to provide the feedback comparison frequency signal ($F_{COMP}$) to the phase frequency detector 302. This completes the feedback loop and enables the PLL circuit 300 to lock to the desired frequency.

Figure 4:
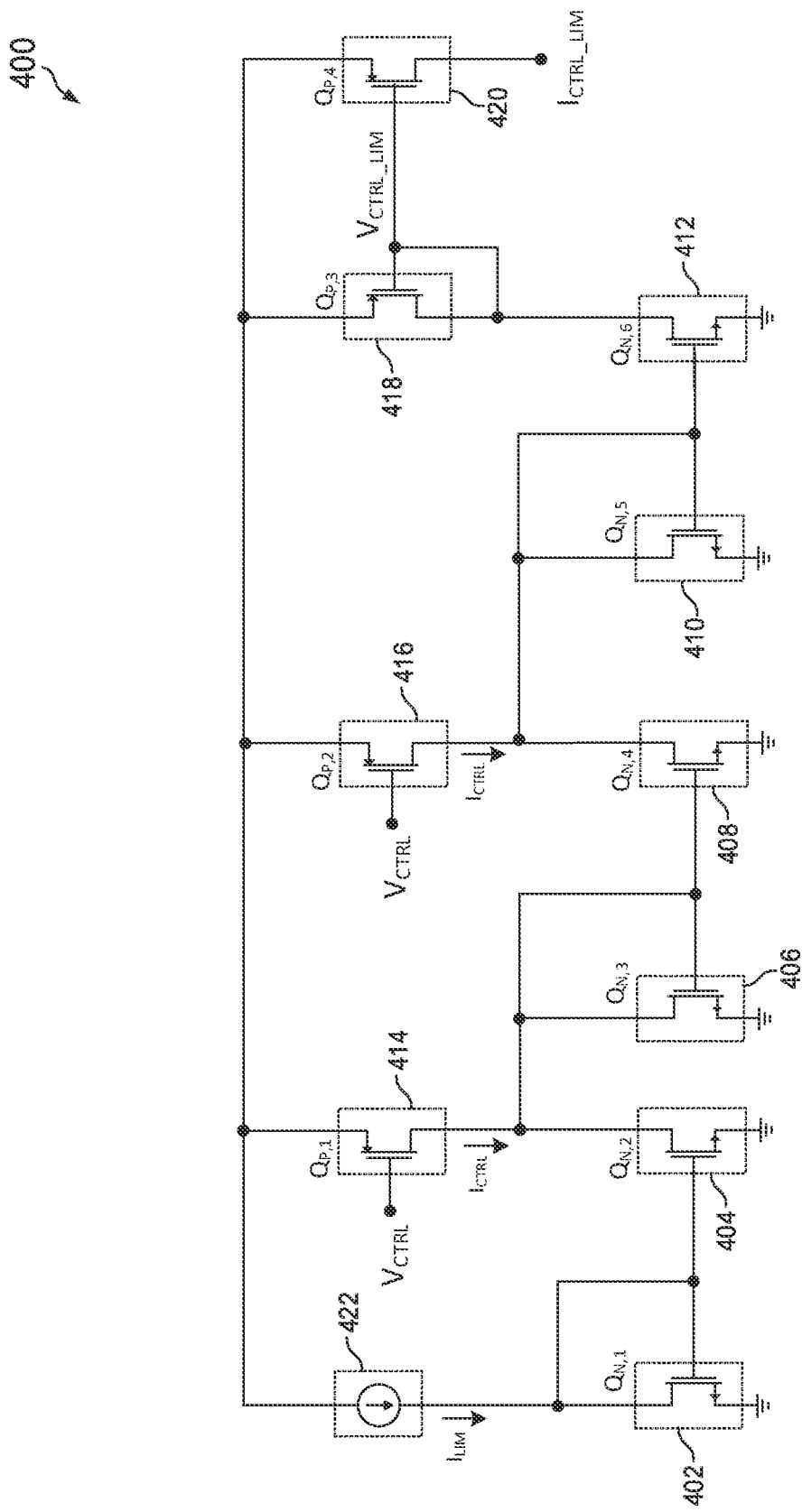
FIG. 4 is a schematic of an embodiment programmable clamp.

FIG. 4 illustrates a schematic of an embodiment programmable clamp 400, which may be implemented as the programmable clamp 308 in the PLL circuit 300. Programmable clamp 400 is configured as a p-channel current mirror controlled oscillator. It should be appreciated that the programmable clamp 400 can be configured as an n channel current mirror-controlled oscillator in other embodiments.

Programmable clamp 400 includes a first n-channel transistor ($Q_{N,1}$) 402, a second n-channel transistor ($Q_{N,2}$) 404, a third n-channel transistor ($Q_{N,3}$) 406, a fourth n-channel transistor ($Q_{N,4}$) 408, a fifth n-channel transistor ($Q_{N,5}$) 410, a sixth n-channel transistor ($Q_{N,6}$) 412, a first p-channel transistor ($Q_{P,1}$) 414, a second p-channel transistor ($Q_{P,2}$) 416, a third p-channel transistor ($Q_{P,3}$) 418, a fourth p-channel transistor ($Q_{P,4}$) 420, and a current source 422, which may (or may not) be arranged as shown. Programmable clamp 400 may include additional components that are not shown. In embodiments, the current source 422 is implemented using a p-channel transistor or a cascode current source.

In embodiments, the second n-channel transistor ($Q_{N,2}$) 404, the fourth p-channel transistor ($Q_{P,4}$) 420, or a combination thereof, are programmable transistors. In embodiments, the second n-channel transistor ($Q_{N,2}$) 404, the fourth p-channel transistor ($Q_{P,4}$) 420, or a combination thereof, are configured as a collection of transistors arranged in parallel.

In embodiments, the unit size of the first n-channel transistor ($Q_{N,1}$) 402 equals the unit size of each transistor in the collection of transistors of the second n-channel transistor ($Q_{N,2}$) 404.

In embodiments, the unit size of the third p-channel transistor ($Q_{P,3}$) 418 equals the unit size of each transistor in the collection of transistors of the fourth p-channel transistor ($Q_{P,4}$) 420.

In embodiments, a subset or the entirety of the transistors in the collection of transistors of the second n-channel transistor ($Q_{N,2}$) 404 can be enabled or disabled such that the effective width-to-length ratio $$\left(\frac{W}{L}\right)_{N,2}$$

of the second n-channel transistor ($Q_{N,2}$) 404 with respect to the width-to-length ratio $$\left(\frac{W}{L}\right)_{N,1}$$

of the first n-channel transistor ($Q_{N,1}$) 402 equals N.

In embodiments, a subset or the entirety of the transistors in the collection of transistors of the fourth p-channel transistor ($Q_{P,4}$) 420 can be enabled or disabled such that the effective width-to-length ratio $$\left(\frac{W}{L}\right)_{P,4}$$

of the fourth p-channel transistor ($Q_{P,4}$) 420 with respect to the width-to-length ratio $$\left(\frac{W}{L}\right)_{P,3}$$

of the third p-channel transistor ($Q_{P,3}$) 418 equals M.

In embodiments, the programmable clamp 400 is coupled to a memory hosted in the system 200 or the memory of a host device. In embodiments, the selections of the subset or the entirety of the transistors in the collection of transistors of the fourth p-channel transistor ($Q_{P,4}$) 420 and the second n-channel transistor ($Q_{N,2}$) 404 are stored in the memory such that when the system 200 is turned ON, the system 200 is calibrated.

The source terminals of the first n-channel transistor ($Q_{N,1}$) 402, the second n-channel transistor ($Q_{N,2}$) 404, the third n-channel transistor ($Q_{N,3}$) 406, the fourth n-channel transistor ($Q_{N,4}$) 408, the fifth n-channel transistor ($Q_{N,5}$) 410, and the sixth n-channel transistor ($Q_{N,6}$) 412 are coupled to reference ground.

The first n-channel transistor ($Q_{N,1}$) 402, the third n-channel transistor ($Q_{N,3}$) 406, the fifth n-channel transistor ($Q_{N,5}$) 410, and the third p-channel transistor ($Q_{P,3}$) 418 are configured as a diode-connected transistor (i.e., having a drain-to-gate connection).

The gate terminal of the first n-channel transistor ($Q_{N,1}$) 402 is coupled to the gate terminal of the second n-channel transistor ($Q_{N,2}$) 404. The gate terminal of the third n-channel transistor ($Q_{N,3}$) 406 is coupled to the gate terminal of the fourth n-channel transistor ($Q_{N,4}$) 408. The gate terminal of the fifth n-channel transistor ($Q_{N,5}$) 410 is coupled to the gate terminal of the sixth n-channel transistor ($Q_{N,6}$) 412.

The gate terminal of the third p-channel transistor ($Q_{P,3}$) 418 is coupled to the gate terminal of the fourth p-channel transistor ($Q_{P,4}$) 420, which is the output of the programmable clamp 400. The gate terminals of the first p-channel transistor ($Q_{P,1}$) 414 and the second p-channel transistor ($Q_{P,2}$) 416 are coupled to the output of the low-pass filter 306 and configured to receive the voltage control ($V_{CTRL}$) signal. The gate terminals The drain terminal of the first n-channel transistor ($Q_{N,1}$) 402 is coupled to a first terminal of the current source 422. A second terminal of the current source 422 is coupled to the source terminals of the first p-channel transistor ($Q_{P,1}$) 414, the second p-channel transistor ($Q_{P,2}$) 416, the third p-channel transistor ($Q_{P,3}$) 418, and the fourth p-channel transistor ($Q_{P,4}$) 420.

The drain terminals of the second n-channel transistor ($Q_{N,2}$) 404 and the third n-channel transistor ($Q_{N,3}$) 406 are coupled to the drain terminal of the first p-channel transistor ($Q_{P,1}$) 414. The drain terminals of the fourth n-channel transistor ($Q_{N,4}$) 408 and the t fifth n-channel transistor ($Q_{N,5}$) 410 are coupled to the drain terminal of the second p-channel transistor ($Q_{P,2}$) 416. The drain terminal of the third p-channel transistor ($Q_{P,3}$) 418 is coupled to the drain terminal of the sixth n-channel transistor ($Q_{N,6}$) 412.

When the first p-channel transistor ($Q_{P,1}$) 414 is enabled, the current flowing through the drain terminal of the first p-channel transistor ($Q_{P,1}$) 414 is equal to the control current ($I_{CTRL}$).

The first n-channel transistor ($Q_{N,1}$) 402 and the second n-channel transistor ($Q_{N,2}$) 404 are arranged as a first n-channel current mirror. The current flowing through the drain of the second n-channel transistor ($Q_{N,2}$) 404 can be controlled by setting the ratio N.

Accordingly, if the $$\left(\frac{W}{L}\right)_{N,2}$$

of the second n-channel transistor ($Q_{N,2}$) 404 is N times the $$\left(\frac{W}{L}\right)_{N,1}$$

of the first n-channel transistor ($Q_{N,1}$) 402, the current flowing through the drain terminal of the second n-channel transistor ($Q_{N,2}$) 404 is N times the limit current ($I_{LIM}$).

Thus, the current flowing through the drain terminal of the third n-channel transistor ($Q_{N,3}$) 406 is equal to the control current ($I_{CTRL}$) minus N times the limit current ($I_{LIM}$) or $I_{CTRL} - N \times I_{LIM}$. However, if the current flowing through the drain terminal of the second n-channel transistor ($Q_{N,2}$) 404 exceeds the control current ($I_{CTRL}$) (i.e., $I_{CTRL} \leq N \times I_{LIM}$), no current flows through the drain terminal of the third n-channel transistor ($Q_{N,3}$) 406. This relationship for the current flowing ($I_{N,3}$) through the drain terminal of the third n-channel transistor ($Q_{N,3}$) 406 can be represented by the equation: $I_{N,3} = MAX(I_{CTRL} - N \times I_{LIM}, 0)$.

The third n-channel transistor ($Q_{N,3}$) 406 and the fourth n-channel transistor ($Q_{N,4}$) 408 are arranged as a second n-channel current mirror. The third n-channel transistor ($Q_{N,3}$) 406 and the fourth n-channel transistor ($Q_{N,4}$) 408 are selected such that they have equal parameters $$\text{(e.g., } \left(\frac{W}{L}\right)_{N,3} = \left(\frac{W}{L}\right)_{N,4}.$$

Accordingly, the current flowing through the drain terminal of the fourth n-channel transistor ($Q_{N,4}$) 408 equals the current flowing through the drain terminal of the third n-channel transistor ($Q_{N,3}$) 406.

When the second p-channel transistor ($Q_{P,2}$) 416 is enabled, the current flowing through the drain terminal of the second p-channel transistor ($Q_{P,2}$) 416 is equal to the control current ($I_{CTRL}$).

The current flowing through the drain terminal of the fifth n-channel transistor ($Q_{N,5}$) 410 equals the control current ($I_{CTRL}$) minus the control current ($I_{CTRL}$) plus N times the limit current ($I_{LIM}$) or $I_{CTRL}-I_{CTRL}+N\times I_{LIM}=N\times I_{LIM}$. However, if no current flows through the drain terminal of the third n-channel transistor ($Q_{N,3}$) 406, the current flowing through the drain terminal of the fifth n-channel transistor ($Q_{N,5}$) 410 equals the control current ($I_{CTRL}$). This relationship for the current flowing ($I_{N,5}$) through the drain terminal of the fifth n-channel transistor ($Q_{N,5}$) 410 can be represented by the equation: $I_{N,5}=\text{MIN}(I_{CTRL}, N\times I_{LIM})$.

The fifth n-channel transistor ($Q_{N,5}$) 410 and the sixth n-channel transistor ($Q_{N,6}$) 412 are arranged as a third n-channel current mirror. The fifth n-channel transistor ($Q_{N,5}$) 410 and the sixth n-channel transistor ($Q_{N,6}$) 412 are selected such that they have equal parameters (e.g., $$\text{(e.g., } \left(\frac{W}{L}\right)_{N,5} = \left(\frac{W}{L}\right)_{N,6}.$$

Accordingly, the current flowing through the drain terminal of the sixth n-channel transistor ($Q_{N,6}$) 412 equals the current flowing through the drain terminal of the fifth n-channel transistor ($Q_{N,5}$) 410

The third p-channel transistor ($Q_{P,3}$) 418 and the fourth p-channel transistor ($Q_{P,4}$) 420 are arranged as a first p-channel current mirror. The current flowing through the drain of the fourth p-channel transistor ($Q_{P,4}$) 420 can be controlled by setting the ratio M.

Accordingly, if the $$\left(\frac{W}{L}\right)_{P,4}$$

of the fourth p-channel transistor ($Q_{P,4}$) 420 is M times the $$\left(\frac{W}{L}\right)_{P,3}$$

of the third p-channel transistor ($Q_{P,3}$) 418, the current flowing through the drain terminal of the fourth p-channel transistor ($Q_{P,4}$) 420 is M times the N times the limit current ($I_{LIM}$) or $M\times N\times I_{LIM}$. However, if the current flowing the drain terminal of the sixth n-channel transistor ($Q_{N,6}$) 412 equals the control current ($I_{CTRL}$), the current flowing through the drain terminal of the fourth p-channel transistor ($Q_{P,4}$) 420 is M times the limit current ($I_{LIM}$) or $M\times I_{LIM}$. This relationship for the current flowing ($I_{P,4}$) through the drain terminal of the fourth p-channel transistor ($Q_{P,4}$) 420 can be represented by the equation: $I_{P,4}=\text{MIN}(M\times I_{CTRL}, M\times N\times I_{LIM})$.

The current ($I_{CTRL\_LIM}$) flowing through the drain terminal of the fourth p-channel transistor ($Q_{P,4}$) 420 is provided as an input signal to the voltage-controlled oscillator 310, which dictates the frequency of the voltage-controlled oscillator 310.

In embodiments, the fourth p-channel transistor ($Q_{P,4}$) 420 is a transistor of the voltage-controlled oscillator 310. In such embodiments, the fourth p-channel transistor ($Q_{P,4}$) 420 converts the limited voltage control ($V_{CTRL\_LIM}$) to the current ($I_{CTRL\_LIM}$). The current ($I_{CTRL\_LIM}$) tunes the output frequency of a ring oscillator for the voltage-controlled oscillator 310.

Therefore, by programming and storing the values N and M in the memory, the control signal to the voltage-controlled oscillator 310 can be set such that the frequency of the output signal of the PLL circuit 300 is within the operating range of the digital circuit 201.

Figure 5:
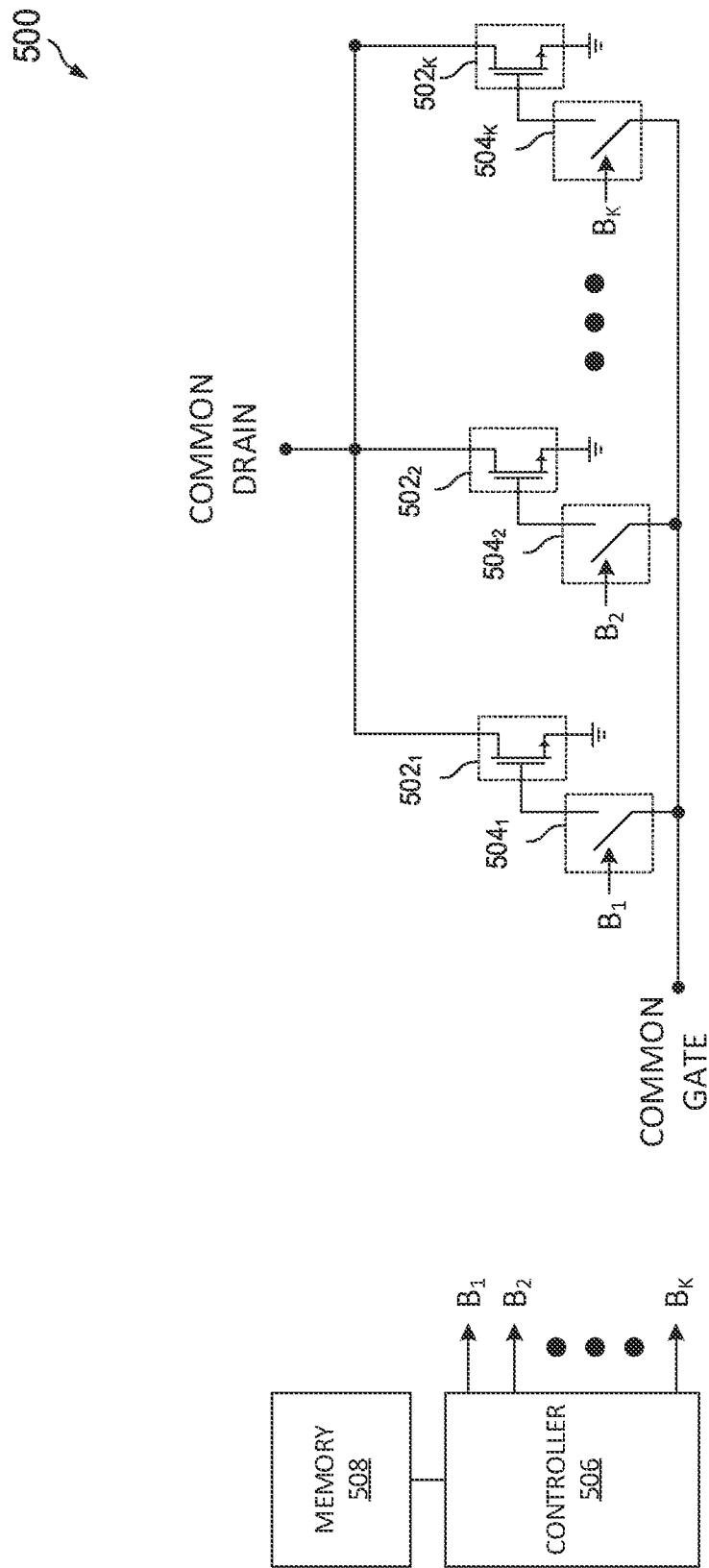
FIG. 5 is a schematic of an embodiment programmable n-channel transistor.

FIG. 5 illustrates a schematic of an embodiment programmable n-channel transistor 500, which may be implemented as the second n-channel transistor ($Q_{N,2}$) 404. Programmable n-channel transistor 500 includes K number of switches $504_1$-$504_K$ and K number of n-channel transistors $502_1$-$502_K$, where K is greater than N. The unit size of each n-channel transistor 502 equals the unit size of the first n-channel transistor ($Q_{N,1}$) 402.

The K number of n-channel transistors $502_1$-$502_K$ are arranged in parallel, such that the source terminal of each n-channel transistor 502 is coupled to the reference ground. The drain terminal of each n-channel transistor 502 is coupled to the shared node between the drain terminals of the third n-channel transistor ($Q_{N,3}$) 406 and the first p-channel transistor ($Q_{P,1}$) 414.

The gate terminal of each n-channel transistor 502 is coupled to a respective switch 504. In embodiments, switches $504_1$-$504_K$ are implemented as transistors. In embodiments, a controller 506 coupled to each switch 504 provides a corresponding control signal Br-Bx to configure the associated switch $504_1$-$504_K$ in a closed or open position. In embodiments, the controller 506 retrieves the configuration of each n-channel transistor 502 from memory 508, which stores the configuration for the programmable n-channel transistor 500 based on, for example, a calibrated setting of the system 200.

For example, to implement the programmable n-channel transistor 500 as the second n-channel transistor ($Q_{N,2}$) 404, the controller 506 enables (i.e., arranged in a closed position) N of the K number of switches 504, while the K-N number of switches 504 are disabled (i.e., arranged in an open position).

In embodiments, by enabling a single one of the K number of switches $504_1$-$504_K$, the unit size ratio of the programmable n-channel transistor 500 equals the first n-channel transistor ($Q_{N,1}$) 402. By enabling all K number of switches $504_1$-$504_K$, the unit size ratio of the programmable n-channel transistor 500 is K times the first n-channel transistor ($Q_{N,1}$) 402. Accordingly, by selectively enabling a subset of the K number of switches $504_1$-$504_K$, the unit size ratio of the programmable n-channel transistor 500 to the first n-channel transistor ($Q_{N,1}$) 402 can be set.

In embodiments, each control signal $B_1$-$B_K$, to configure the switch $504_1$-$504_K$, is coupled to the drain terminal of the respective n-channel transistor $502_1$-$502_K$. In embodiments, the width-to-length ratio, in reference to the first n-channel transistor ($Q_{N,1}$) 402, of the n-channel transistors $502_1$-$502_K$ are sized in binary multiple increments. For example, in an embodiment, the first n-channel transistor 5021 has a width-to-length ratio (in reference to the first n-channel transistor ($Q_{N,1}$) 402) of 1× (unitary ratio), the second n-channel transistor 5022 has a width-to-length ratio (in reference to the first n-channel transistor ($Q_{N,1}$) 402) of 2×, and so forth.

Figure 6:
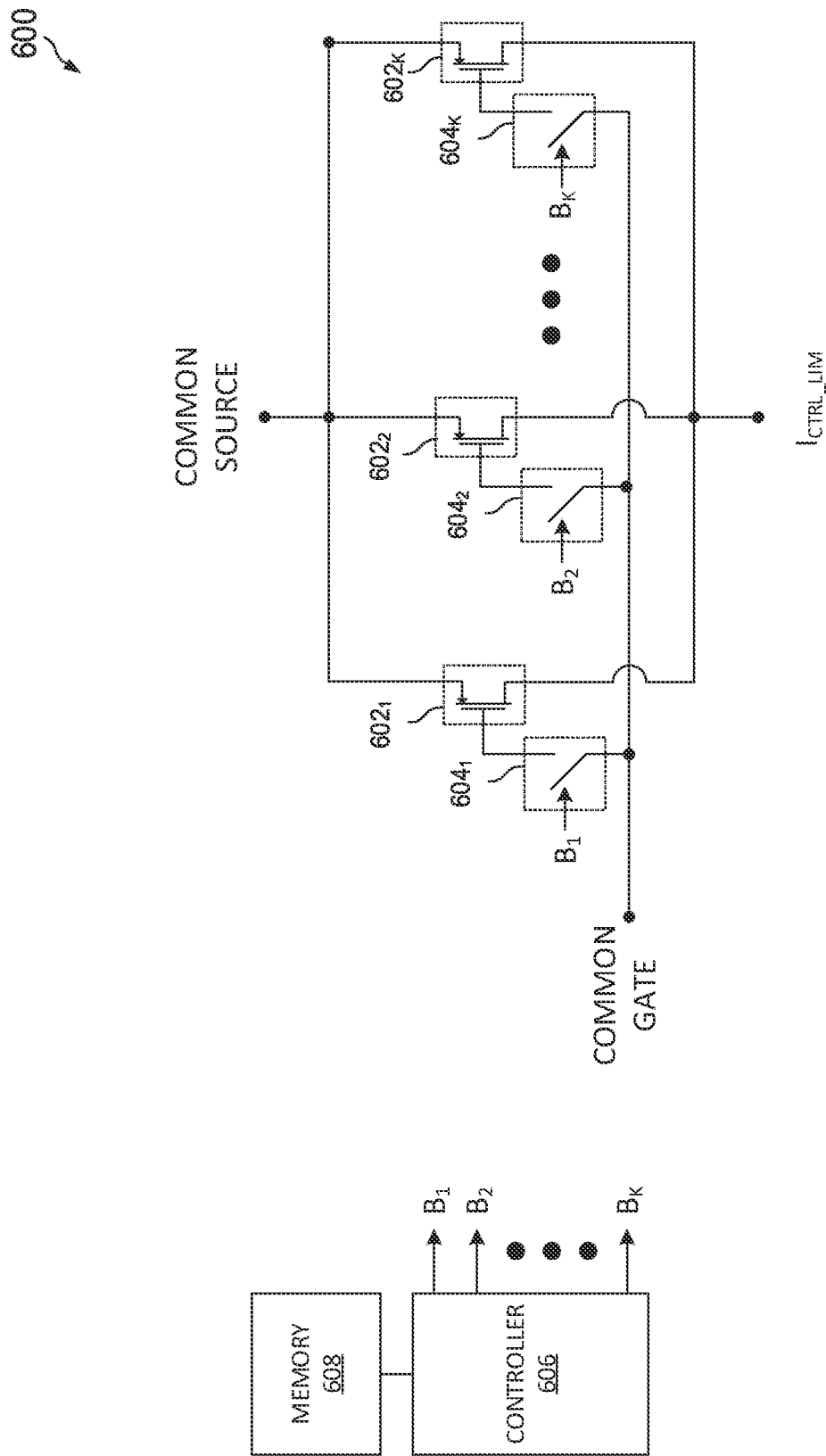
FIG. 6 is a schematic of an embodiment programmable p-channel transistor.

FIG. 6 illustrates a schematic of an embodiment programmable p-channel transistor 600, which may be implemented as the fourth p-channel transistor ($Q_{P,4}$) 420. Programmable p-channel transistor 600 includes K number of switches $604_1$-$604_K$ and K number of p-channel transistors $602_1$-$602_K$, where K is greater than M. The unit size of each p-channel transistor 602 equals the unit size of the fourth p-channel transistor ($Q_{P,4}$) 420.

It is noted that in embodiments, the quantity of p-channel transistors $602_1$-$602_K$ in programmable p-channel transistor 600 can differ from the quantity of n-channel transistors $502_1$-$502_K$ in programmable n-channel transistor 500.

The K number of p-channel transistors $602_1$-$602_K$ are arranged in parallel, such that the source terminal of each p-channel transistor 602 is coupled to a common source node. The drain terminal of each p-channel transistor 602 is coupled to a common drain node, which provides the current ($I_{CTRL\_LIM}$) as the output of the programmable clamp 400.

The gate terminal of each p-channel transistor 602 is coupled to a respective switch 604. In embodiments, switches $604_1$-$604_K$ are implemented as transistors. In embodiments, a controller 606 coupled to each switch 604 provides a corresponding control signal Br-Bx to configure the associated switch $604_1$-$604_k$ in a closed or open position.

In embodiments, the controller 606 retrieves the configuration of each p-channel transistor 602 from memory 608, which stores the configuration for the programmable p-channel transistor 600 based on, for example, a calibrated setting of the system 200. In embodiments, memory 608 is a non-volatile or one-time programmable (OTP) memory type.

For example, to implement the programmable p-channel transistor 600 as the fourth p-channel transistor ($Q_{P,4}$) 420, the controller 606 enables (i.e., arranged in a closed position) M of the K number of switches 604, while the K-M number of switches 604 are disabled (i.e., arranged in an open position).

By enabling a single one of the K number of switches $604_1$-$604_K$, the unit size ratio of the programmable p-channel transistor 600 equals the fourth p-channel transistor ($Q_{P,4}$) 420. By enabling all K number of switches $604_1$-$604_K$, the unit size ratio of the programmable p-channel transistor 6500 is K times the fourth p-channel transistor ($Q_{P,4}$) 420. Accordingly, by selectively enabling a subset of the K number of switches $604_1$-$604_K$, the unit size ratio of the programmable p-channel transistor 600 to the fourth p-channel transistor ($Q_{P,4}$) 420 can be set.

In embodiments, each control signal $B_1$-$B_K$, to configure the switch $604_1$-$604_K$, is coupled to the drain terminal of the respective p-channel transistor $602_1$-$602_K$. In embodiments, the width-to-length ratio, in reference to the fourth p-channel transistor ($Q_{P,4}$) 420, of the p-channel transistors $602_1$-$602_K$ are sized in binary multiple increments. For example, in an embodiment, the first p-channel transistor $602_1$ has a width-to-length ratio (in reference to the fourth p-channel transistor ($Q_{P,4}$) 420) of 1× (unitary ratio), the second p-channel transistor 6022 has a width-to-length ratio (in reference to the fourth p-channel transistor ($Q_{P,4}$) 420) of 2×, and so forth.

Figure 7:
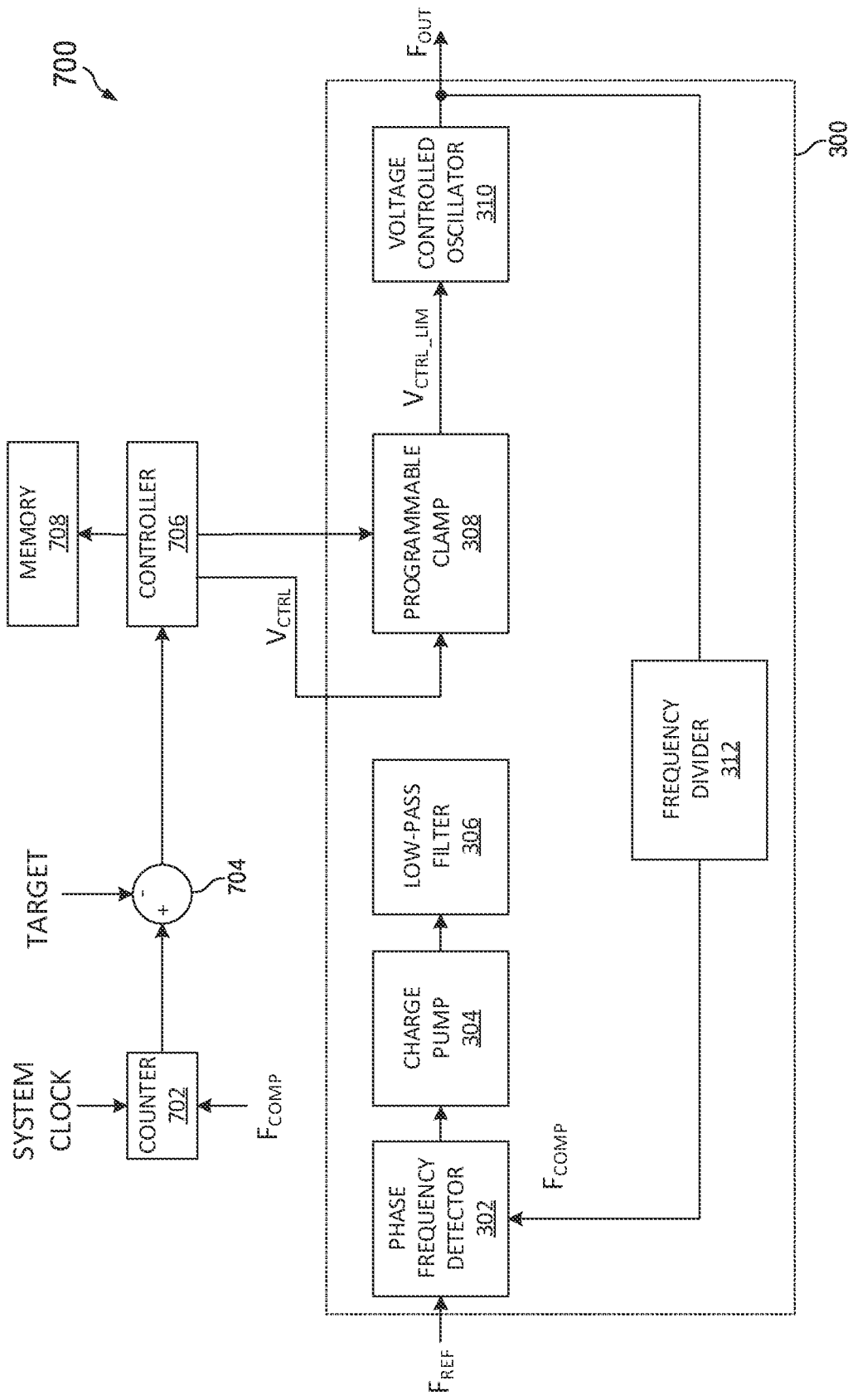
FIG. 7 is a block diagram of an embodiment calibration system for calibrating the PLL circuit of FIG. 3.

FIG. 7 illustrates a block diagram of an embodiment calibration system 700 for calibrating PLL circuit 300. To calibrate the PLL circuit 300, the PLL circuit 300 is configured in an open-loop configuration, such that the output of the low-pass filter 306 is not coupled to the programmable clamp 308. Instead, an external source provides the control voltage ($V_{CTRL}$) to the programmable clamp 308. In embodiments, the controller 610 is configured to provide the control voltage ($V_{CTRL}$), which will set the feedback comparison frequency signal ($F_{COMP}$) to the maximum frequency without the programmable clamp 308.

Calibration system 700 includes the PLL circuit 300, a counter 702, a subtractor circuit 704, a controller 706, and a memory, which may (or may not) be arranged as shown. In embodiments, the calibration system 700 is integrated within the PLL circuit 300 and on the same chip.

Counter 702 is configured to receive the feedback comparison frequency signal ($F_{COMP}$) and the system clock signal. In embodiments, the system clock signal originates from a well-regulated on-chip oscillator, providing a precise clock signal at, for example, a frequency of 20 MHz. This oscillator has been previously calibrated to ensure its accuracy and stability. The counter 702 is configured to convert the frequency of the feedback comparison frequency signal ($F_{COMP}$) into a digital signal to be compared with a target signal at the subtractor circuit 704.

Subtractor circuit 704 receives the output signal from counter 702 at the non-inverting input and subtracts the target signal provided at the inverting input. The output of the subtractor circuit 704 is provided as an error signal to the controller 706 indicating an error (i.e., the difference between the target and the current value). The calibration system 700 is configured to minimize the error by performing a calibration sweep. In embodiments, the error signal is provided as an absolute value.

In embodiments, the target signal corresponds to the maximum frequency of the output signal ($F_{OUT}$) of the PLL circuit 300 that is within the operating range of the digital circuit 201 or within the operating range of the digital circuit 201 with some margin.

In embodiments, during the calibration sweep, different ratios of N and M are set by the controller 706 at the second n-channel transistor ($Q_{N,2}$) 404 and the fourth p-channel transistor ($Q_{P,4}$) 420. As detailed above, the different ratios of N and M are set by enabling and disabling transistors in each programmable transistor.

Once the controller 706 has completed the calibration sweep, the calibration settings with the smallest error are stored in memory 708 for each of the second n-channel transistor ($Q_{N,2}$) 404 and the fourth p-channel transistor ($Q_{P,4}$) 420. During the startup of system 200, controller 706 is configured to retrieve the calibration settings in memory 708 and set the transistors of the second n-channel transistor ($Q_{N,2}$) 404 and the fourth p-channel transistor ($Q_{P,4}$) 420.

In embodiments, the calibration system 700 includes an absolute block circuit and a comparator circuit (not shown). The absolute block circuit is arranged between the subtractor circuit and the comparator circuit, and the comparator circuit is arranged between the absolute block circuit and the controller 706. Using the comparator circuit, the absolute block circuit is configured to measure a discrepancy between the target and the predetermined acceptable deviation. The search algorithm is halted if the discrepancy falls within the allowable tolerance range.

Figure 8:
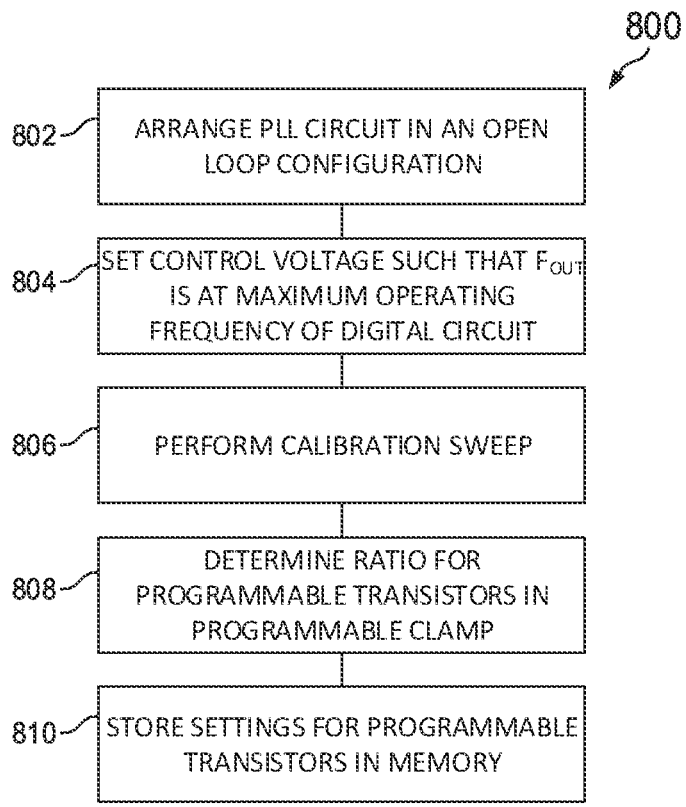
FIG. 8 is a flow chart of an embodiment method to calibrate the programmable clamp of FIG. 4.

FIG. 8 illustrates a flow chart of an embodiment method 800 to calibrate the programmable clamp 400. It is noted that all steps outlined in the flow chart of method 800 are not necessarily required and can be optional. Further, changes to the arrangement of the steps, removal of one or more steps and path connections, and addition of steps and path connections are similarly contemplated. In embodiments, the calibration of the programmable clamp 400 is automated in a test mode.

At step 802, the PLL circuit 300 is configured in test mode, where it is arranged in an open loop configuration. In the open loop configuration, the output of the low-pass filter 306 is not coupled to the programmable clamp 308. Instead, an external source provides the control voltage ($V_{CTRL}$) to the programmable clamp 308. In embodiments, the controller 610 is configured to provide the control voltage ($V_{CTRL}$).

At step 804, the control voltage ($V_{CTRL}$) is set such that the frequency of the output signal ($F_{OUT}$) is at the maximum operating frequency range of the digital circuit 201. For example, in the programmable clamp 400, which is arranged as a p-channel current mirror controlled oscillator, the control voltage ($V_{CTRL}$) is set to zero. In embodiments where the programmable clamp 308 is arranged as an n-channel current mirror controlled oscillator, the control voltage ($V_{CTRL}$) is set to the supply voltage ($V_{DD}$).

At step 806, a calibration sweep is performed on the programmable clamp 308. During the calibration sweep, different ratios of N and M are set at, respectively, the second n-channel transistor ($Q_{N,2}$) 404 and the fourth p-channel transistor ($Q_{P,4}$) 420. The feedback comparison frequency signal ($F_{COMP}$) is monitored for each setting.

At step 808, the settings for the second n-channel transistor ($Q_{N,2}$) 404 and the fourth p-channel transistor ($Q_{P,4}$) 420 are determined such that the limited control signal provided by the programmable clamp 308 to the voltage-controlled oscillator 310 is set such that the frequency of the output signal ($F_{OUT}$) of the PLL circuit 300 is within the operating range of the digital circuit 201.

In embodiments, the settings for the second n-channel transistor ($Q_{N,2}$) 404 and the fourth p-channel transistor ($Q_{P,4}$) 420 are determined such that the limited control signal provided by the programmable clamp 308 to the voltage-controlled oscillator 310 is set such that the frequency of the output signal ($F_{OUT}$) of the PLL circuit 300 is within the operating range of the digital circuit 201 by a margin.

In embodiments, the settings for the second n-channel transistor ($Q_{N,2}$) 404 and the fourth p-channel transistor ($Q_{P,4}$) 420 correspond to the configuration of switches to be enabled or disabled for each programmable transistor.

At step 810, the settings the settings for the second n-channel transistor ($Q_{N,2}$) 404 and the fourth p-channel transistor ($Q_{P,4}$) 420 are stored in memory.

Figure 9:
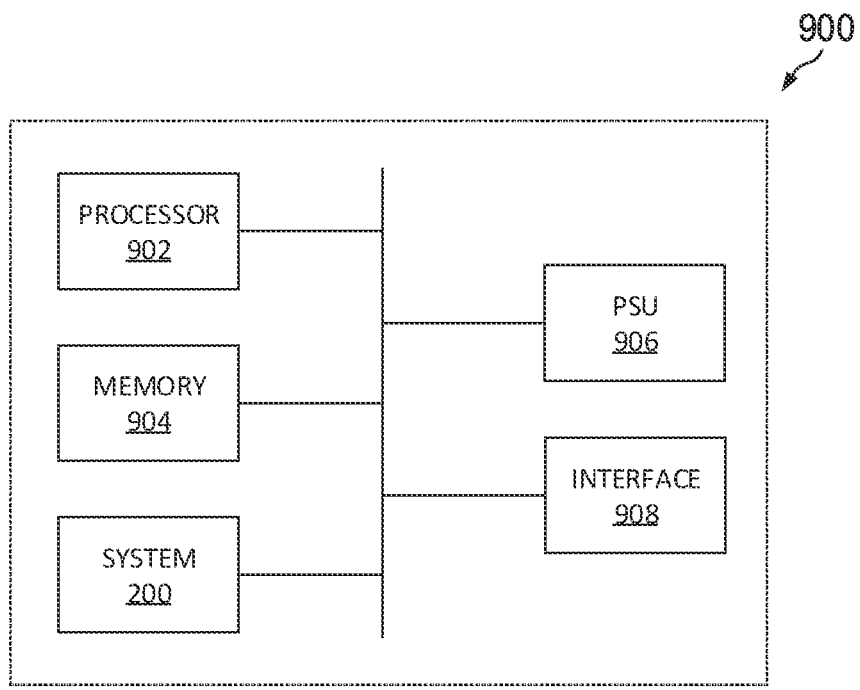
FIG. 9 is a block diagram of an embodiment device for hosting the system of FIG. 2.

FIG. 9 illustrates a block diagram of an embodiment device 900 for hosting the system 200. Device 900 includes a processor 902, a memory 904, the system 200, a power supply unit (PSU) 906, and an interface 908, which may (or may not) be arranged as shown. Although one of each (i.e., the processor 902, the memory 904, the system 200, the power supply unit 906, and the interface 908) is shown in FIG. 9, the number of components is not limiting, and greater numbers are similarly contemplated in other embodiments. Device 900 may include additional components not depicted, such as long-term storage (e.g., non-volatile memory, etc.), power management circuitry, security and encryption modules (e.g., trusted platform modules (TPM), etc.), or the like. Device 900 may be an electronic device, such as a smartphone, a tablet, a laptop, a smartwatch, a vehicle, or any device capable of hosting the system 200.

In embodiments, each component can communicate with any other component internally within or external to the device 900. For example, each component can communicate using the I2C (Inter-Integrated Circuit), alternatively known as I2C or IIC, communication protocol, the I3C (Improved Inter Integrated Circuit) communication protocol, the serial peripheral interface (SPI) specification, or the like.

Processor 902 may be any component or collection of components adapted to perform computations or other processing-related tasks. In embodiments, processor 902 is an application processor, a baseband processor, or a microcontroller. In embodiments, processor 902 is configured to perform the functions of the controller 506 and the controller 606. In embodiments, the processor 902 is an automobile's engine control unit (ECU).

Memory 904 may be any component or collection of components adapted to store programming, instructions, or calibration settings for execution or retrieval by processor 902. In an embodiment, memory 904 includes a non-transitory computer-readable medium. In embodiments, memory 904 is configured to perform the functions of memory 508 and memory 608.

In embodiments, processor 902 receives data from system 200, interprets the data, and converts it into usable information, such as detecting whether to deploy an airbag in a vehicle. The processor 902 may apply algorithms to refine the data, compensating for factors like ambient light noise or object reflectivity variations to provide more reliable distance information.

Power supply unit 906 may be any component or collection of components that provide power to one or more components within the device 900. Power supply unit 906 may include various power management circuitry, charge storage components (i.e., battery), and the like.

Interface 908 may be any component or collection of components that allow processor 902 to communicate with other devices/components or a user.

A first aspect relates to a phased-locked loop (PLL) circuit for generating demodulation signals in a gyroscope system. The PLL circuit includes a phase frequency detector coupled to an output of a gyroscope in the gyroscope system, the phase frequency detector configured to generate an error signal by comparing an input reference signal with a feedback comparison frequency signal; a charge pump configured to translate error information of the error signal into a first analog control signal; a programmable clamp circuit configured to generate a second analog control signal from the first analog control signal; a voltage-controlled oscillator configured to receive the second analog control signal and generate an output signal having a regulated frequency, wherein the regulated frequency is set by the second analog control signal generated by the programmable clamp circuit; and a frequency divider configured to provide the feedback comparison frequency signal to the phase frequency detector based on the regulated frequency of the output signal.

In a first implementation form of the PLL circuit, according to the first aspect as such, the programmable clamp circuit is a current mirror controlled oscillator having programmable transistors, wherein the programmable transistors are set during a calibration phase based on a maximum value of the regulated frequency.

In a second implementation form of the PLL circuit, according to the first aspect as such or any preceding implementation form of the first aspect, the programmable transistors are set by retrieving settings for each programmable transistor from a memory.

In a third implementation form of the PLL circuit, according to the first aspect as such or any preceding implementation form of the first aspect, the settings for each programmable transistor are stored in the memory during the calibration phase. The settings are retrieved from the memory during a startup phase of the gyroscope system.

In a fourth implementation form of the PLL circuit, according to the first aspect as such or any preceding implementation form of the first aspect, the calibration phase includes sweeping settings for each programmable transistor to minimize an error signal between the output signal of the PLL circuit and a target value corresponding to the maximum value of the regulated frequency.

In a fifth implementation form of the PLL circuit, according to the first aspect as such or any preceding implementation form of the first aspect, the PLL circuit is configured in an open loop configuration during the calibration phase. The first analog control signal is set to zero volts for a p-channel current mirror controlled oscillator or set to a supply voltage of the gyroscope system for an n-channel current mirror controlled oscillator.

In a sixth implementation form of the PLL circuit, according to the first aspect as such or any preceding implementation form of the first aspect, the calibration phase includes sweeping settings for each programmable transistor to minimize an error signal between the output signal of the PLL circuit and a target value corresponding to the maximum value of the regulated frequency minus a margin.

A second aspect relates to system that includes a gyroscope configured to detect changes in a vibration of a proof mass due to a drive motion by generating first signals; a charge-to-voltage converter configured to convert the first signals to a differential sine wave signal, the first signals being charge signals, and the differential sine wave signal being equivalent voltage signals to the first signals; and a drive comparator configured to eliminate false pulses due to high-frequency signals and noise superimposed on top of the differential sine wave signal; a phase frequency detector coupled to an output of the drive comparator, the phase frequency detector configured to generate an error signal by comparing a first output signal at the output of the drive comparator with a feedback comparison frequency signal; a charge pump configured to translate error information of the error signal into a first analog control signal; a programmable clamp circuit configured to generate a second analog control signal from the first analog control signal; a voltage-controlled oscillator configured to receive the second analog control signal and generate a second output signal having a regulated frequency, wherein the regulated frequency is set by the second analog control signal generated by the programmable clamp circuit; and a frequency divider configured to provide the feedback comparison frequency signal to the phase frequency detector based on the regulated frequency of the second output signal.

In a first implementation form of the system, according to the second aspect as such, the programmable clamp circuit is a current mirror controlled oscillator having programmable transistors. The programmable transistors are set during a calibration phase based on a maximum value of the regulated frequency.

In a second implementation form of the system, according to the second aspect as such or any preceding implementation form of the second aspect, the programmable transistors are set by retrieving settings for each programmable transistor from a memory.

In a third implementation form of the system, according to the second aspect as such or any preceding implementation form of the second aspect, the settings for each programmable transistor are stored in the memory during the calibration phase. The settings are retrieved from the memory during a startup phase of the system.

In a fourth implementation form of the system, according to the second aspect as such or any preceding implementation form of the second aspect, the calibration phase includes sweeping settings for each programmable transistor to minimize an error signal between the second output signal and a target value corresponding to the maximum value of the regulated frequency.

In a fifth implementation form of the system, according to the second aspect as such or any preceding implementation form of the second aspect, the PLL circuit is configured in an open loop configuration during the calibration phase. The first analog control signal is set to zero volts for a p-channel current mirror controlled oscillator or set to a supply voltage of the system for an n-channel current mirror controlled oscillator.

In a sixth implementation form of the system, according to the second aspect as such or any preceding implementation form of the second aspect, the calibration phase includes sweeping settings for each programmable transistor to minimize an error signal between the second output signal and a target value corresponding to the maximum value of the regulated frequency minus a margin.

A third aspect relates to a method for calibrating a phased-locked loop (PLL) circuit used to generated modulation signals in a gyroscope system. The method includes arranging the PLL circuit in an open loop configuration; setting an input voltage to a programmable clamp circuit of the PLL circuit to zero volts in response to the programmable clamp circuit being configured as a p-channel current mirror controlled oscillator or set to a supply voltage of the gyroscope system in response to the programmable clamp circuit being configured as an n-channel current mirror controlled oscillator; sweeping the settings for each programmable transistor of the programmable clamp circuit to minimize an error signal between an output signal of the PLL circuit and a target value corresponding to a maximum value of a regulated frequency at an output of the PLL circuit; storing in a memory the settings for each programmable transistor based on determining values for each programmable transistor with a minimal error signal during the sweep; and applying the settings for each programmable transistor from memory during a startup phase of the gyroscope system.

In a first implementation form of the method, according to the third aspect as such, the method further includes sweeping settings for each programmable transistor to minimize an error signal between the output signal of the PLL circuit and a target value corresponding to a maximum value of the regulated frequency minus a margin.

In a second implementation form of the method, according to the third aspect as such or any preceding implementation form of the third aspect, the target value corresponds to a maximum frequency of the output signal of the PLL circuit that is within an operating range of a digital circuit coupled to an output of the PLL circuit.

In a third implementation form of the method, according to the third aspect as such or any preceding implementation form of the third aspect, the target value corresponds to a maximum frequency of the output signal of the PLL circuit that is within an operating range of a digital circuit with a margin, the digital circuit coupled to an output of the PLL circuit.

In a fourth implementation form of the method, according to the third aspect as such or any preceding implementation form of the third aspect, the method further includes generating, by a controller coupled to the programmable clamp circuit, settings for each programmable transistor during the sweep.

In a fifth implementation form of the method, according to the third aspect as such or any preceding implementation form of the third aspect, the method further includes generating a control signal at the output of the programmable clamp circuit as an input to a voltage-controlled oscillator of the PLL circuit. The voltage-controlled oscillator generates the output signal of the PLL circuit.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A phased-locked loop (PLL) circuit for generating demodulation signals in a gyroscope system, the PLL circuit comprising:
    a phase frequency detector coupled to an output of a gyroscope in the gyroscope system, the phase frequency detector configured to generate an error signal by comparing an input reference signal with a feedback comparison frequency signal;
    a charge pump configured to translate error information of the error signal into a first analog control signal;
    a programmable clamp circuit configured to generate a second analog control signal from the first analog control signal, the programmable clamp circuit being a current mirror controller oscillator with programmable transistors;
    a voltage-controlled oscillator configured to receive the second analog control signal and generate an output signal having a regulated frequency, wherein the regulated frequency is set by the second analog control signal generated by the programmable clamp circuit, and wherein the programmable transistors are set during a calibration phase based on a maximum value of the regulated frequency; and
    a frequency divider configured to provide the feedback comparison frequency signal to the phase frequency detector based on the regulated frequency of the output signal.

2. The PLL circuit of claim 1, wherein the programmable transistors are set by retrieving settings for each programmable transistor from a memory.

3. The PLL circuit of claim 2, wherein the settings for each programmable transistor are stored in the memory during the calibration phase, and wherein the settings are retrieved from the memory during a startup phase of the gyroscope system.

4. The PLL circuit of claim 1, wherein the calibration phase comprises sweeping settings for each programmable transistor to minimize an error signal between the output signal of the PLL circuit and a target value corresponding to the maximum value of the regulated frequency.

5. The PLL circuit of claim 4, wherein the PLL circuit is configured in an open loop configuration during the calibration phase, and wherein the first analog control signal is set to zero volts for a p-channel current mirror controlled oscillator or set to a supply voltage of the gyroscope system for an n-channel current mirror controlled oscillator.

6. The PLL circuit of claim 1, wherein the calibration phase comprises sweeping settings for each programmable transistor to minimize an error signal between the output signal of the PLL circuit and a target value corresponding to the maximum value of the regulated frequency minus a margin.

7. The PLL circuit of claim 1, wherein the programmable transistors comprise n-channel transistors and p-channel transistors arranged as current mirrors.

8. The PLL circuit of claim 7, wherein a programmable transistor is configured as a collection of transistors arranged in parallel, and wherein a subset or entirety of the transistors in the collection is selectively enabled or disabled to set an effective width-to-length ratio.

9. A system, comprising:
    a gyroscope configured to detect changes in a vibration of a proof mass due to a drive motion by generating first signals;
    a charge-to-voltage converter configured to convert the first signals to a differential sine wave signal, the first signals being charge signals, and the differential sine wave signal being equivalent voltage signals to the first signals; and
    a drive comparator configured to eliminate false pulses due to high-frequency signals and noise superimposed on top of the differential sine wave signal;
    a phase frequency detector coupled to an output of the drive comparator, the phase frequency detector configured to generate an error signal by comparing a first output signal at the output of the drive comparator with a feedback comparison frequency signal;
    a charge pump configured to translate error information of the error signal into a first analog control signal;
    a programmable clamp circuit configured to generate a second analog control signal from the first analog control signal, the programmable clamp circuit being a current mirror controller oscillator with programmable transistors;
    a voltage-controlled oscillator configured to receive the second analog control signal and generate a second output signal having a regulated frequency, wherein the regulated frequency is set by the second analog control signal generated by the programmable clamp circuit, and wherein the programmable transistors are set during a calibration phase based on a maximum value of the regulated frequency; and a frequency divider configured to provide the feedback comparison frequency signal to the phase frequency detector based on the regulated frequency of the second output signal.

10. The system of claim 9, wherein the programmable transistors are set by retrieving settings for each programmable transistor from a memory.

11. The system of claim 10, wherein the settings for each programmable transistor are stored in the memory during the calibration phase, and wherein the settings are retrieved from the memory during a startup phase of the system.

12. The system of claim 9, wherein the calibration phase comprises sweeping settings for each programmable transistor to minimize an error signal between the second output signal and a target value corresponding to the maximum value of the regulated frequency.

13. The system of claim 12, wherein the PLL circuit is configured in an open loop configuration during the calibration phase, and wherein the first analog control signal is set to zero volts for a p-channel current mirror controlled oscillator or set to a supply voltage of the system for an n-channel current mirror controlled oscillator.

14. The system of claim 12, wherein the calibration phase comprises sweeping settings for each programmable transistor to minimize an error signal between the second output signal and a target value corresponding to the maximum value of the regulated frequency minus a margin.

15. A method for calibrating a phased-locked loop (PLL) circuit used to generate modulation signals in a gyroscope system, the method comprising:
  arranging the PLL circuit in an open loop configuration;
  setting an input voltage to a programmable clamp circuit of the PLL circuit to zero volts in response to the programmable clamp circuit being configured as a p-channel current mirror controlled oscillator or set to a supply voltage of the gyroscope system in response to the programmable clamp circuit being configured as an n-channel current mirror controlled oscillator;
  sweeping the settings for each programmable transistor of the programmable clamp circuit to minimize an error signal between an output signal of the PLL circuit and a target value corresponding to a maximum value of a regulated frequency at an output of the PLL circuit;
  storing in a memory the settings for each programmable transistor based on determining values for each programmable transistor with a minimal error signal during the sweep; and
  applying the settings for each programmable transistor from memory during a startup phase of the gyroscope system.

16. The method of claim 15, further comprising sweeping settings for each programmable transistor to minimize an error signal between the output signal of the PLL circuit and a target value corresponding to a maximum value of the regulated frequency minus a margin.

17. The method of claim 15, wherein the target value corresponds to a maximum frequency of the output signal of the PLL circuit that is within an operating range of a digital circuit coupled to an output of the PLL circuit.

18. The method of claim 15, wherein the target value corresponds to a maximum frequency of the output signal of the PLL circuit that is within an operating range of a digital circuit with a margin, the digital circuit coupled to an output of the PLL circuit.

19. The method of claim 15, further comprising generating, by a controller coupled to the programmable clamp circuit, settings for each programmable transistor during the sweep.

20. The method of claim 15, further comprising generating a control signal at the output of the programmable clamp circuit as an input to a voltage-controlled oscillator of the PLL circuit, wherein the voltage-controlled oscillator generates the output signal of the PLL circuit.

* * * * *